US012575164B2

(12) United States Patent
Menard

(10) Patent No.: US 12,575,164 B2
(45) Date of Patent: Mar. 10, 2026

(54) SEMICONDUCTOR TRIODE

(71) Applicant: STMICROELECTRONICS (TOURS) SAS, Tours (FR)

(72) Inventor: Samuel Menard, Chauray (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 592 days.

(21) Appl. No.: 17/899,071

(22) Filed: Aug. 30, 2022

(65) Prior Publication Data

US 2022/0416053 A1     Dec. 29, 2022

Related U.S. Application Data

(63) Continuation of application No. 16/230,137, filed on Dec. 21, 2018, now Pat. No. 11,462,624.

(30) Foreign Application Priority Data

Jan. 5, 2018     (FR) ...................................... 1850084

(51) Int. Cl.
| | |
|---|---|
| *H10D 64/64* | (2025.01) |
| *H10D 10/00* | (2025.01) |
| *H10D 10/40* | (2025.01) |
| *H10D 18/00* | (2025.01) |
| *H10D 18/80* | (2025.01) |
| *H10D 64/23* | (2025.01) |
| H10D 62/83 | (2025.01) |
| H10D 64/62 | (2025.01) |

(52) U.S. Cl.
CPC ........... *H10D 64/64* (2025.01); *H10D 10/221* (2025.01); *H10D 10/40* (2025.01); *H10D 18/00* (2025.01); *H10D 18/80* (2025.01);

*H10D 64/231* (2025.01); *H10D 62/83* (2025.01); *H10D 64/62* (2025.01)

(58) Field of Classification Search
CPC ......... H10D 18/00; H10D 18/80; H10D 64/64
See application file for complete search history.

(56) References Cited

U.S. PATENT DOCUMENTS

| | | |
|---|---|---|
| 3,829,880 A | 8/1974 | Krishna |
| 4,812,893 A | 3/1989 | Bacuvier |
| 4,903,105 A | 2/1990 | Najji |
| 4,994,885 A | 2/1991 | Yoshizawa |
| 5,093,705 A | 3/1992 | Voss |

(Continued)

FOREIGN PATENT DOCUMENTS

| | | |
|---|---|---|
| EP | 0107773 A1 | 5/1984 |
| EP | 1076366 A1 | 2/2001 |

(Continued)

OTHER PUBLICATIONS

Gupta et al., "Electrostatic Doping in Semiconductor Devices," *IEEE Transactions on Electron Devices* 20(8):3044-3055, 2017.

(Continued)

*Primary Examiner* — Mounir S Amer
*Assistant Examiner* — Alexander Belousov
(74) *Attorney, Agent, or Firm* — Seed IP Law Group LLP

(57)     ABSTRACT

A vertical semiconductor triode includes a first layer of semiconductor material, the first layer including first and second surfaces, the first surface being in contact with a first electrode forming a Schottky contact.

20 Claims, 4 Drawing Sheets

(56)            References Cited

U.S. PATENT DOCUMENTS

| | | | |
|---|---|---|---|
| 5,883,401 | A | 3/1999 | Pezzani |
| 5,998,813 | A | 12/1999 | Bernier |
| 6,034,381 | A | 3/2000 | Pezzani |
| 6,049,096 | A | 4/2000 | Bernier |
| 6,323,718 | B1 | 11/2001 | Rault et al. |
| 6,380,565 | B1 | 4/2002 | Duclos et al. |
| 6,593,600 | B1 | 7/2003 | Duclos et al. |
| 6,818,927 | B2 | 11/2004 | Simonnet |
| 7,851,274 | B1 | 12/2010 | Shah |
| 8,785,970 | B2 | 7/2014 | Menard |
| 8,901,601 | B2 | 12/2014 | Menard et al. |
| 8,912,566 | B2 | 12/2014 | Hague |
| 9,437,722 | B2 | 9/2016 | Menard et al. |
| 9,455,253 | B2 | 9/2016 | Menard et al. |
| 9,722,061 | B2 | 8/2017 | Menard et al. |
| 9,755,541 | B2 | 9/2017 | Gonthier et al. |
| 9,774,243 | B2 | 9/2017 | Gonthier et al. |
| 10,014,797 | B2 | 7/2018 | Gonthier et al. |
| 2002/0008247 | A1 | 1/2002 | Galtie et al. |
| 2003/0122211 | A1 | 7/2003 | Ladiray |
| 2004/0026711 | A1 | 2/2004 | Gimonet et al. |
| 2004/0135170 | A1 | 7/2004 | Menard |
| 2005/0017263 | A1 | 1/2005 | Simmonet |
| 2005/0245006 | A1 | 11/2005 | Tseng |
| 2005/0269660 | A1 | 12/2005 | Singh |
| 2006/0125055 | A1 | 6/2006 | Menard |
| 2007/0145408 | A1 | 6/2007 | Menard |
| 2011/0284921 | A1 | 11/2011 | Menard |
| 2012/0146089 | A1* | 6/2012 | Menard ................. H10D 18/80 |
| | | | 257/119 |
| 2013/0049065 | A1 | 2/2013 | Menard |
| 2013/0105855 | A1 | 5/2013 | Hague |
| 2014/0001514 | A1 | 1/2014 | Schulze et al. |
| 2014/0110751 | A1 | 4/2014 | Chang et al. |
| 2015/0108537 | A1 | 4/2015 | Menard et al. |
| 2016/0027774 | A1 | 1/2016 | Menard et al. |
| 2016/0027907 | A1 | 1/2016 | Menard et al. |
| 2016/0301298 | A1 | 10/2016 | Gonthier et al. |
| 2016/0301326 | A1 | 10/2016 | Gonthier et al. |
| 2016/0373021 | A1 | 12/2016 | Gonthier |
| 2017/0271490 | A1 | 9/2017 | Ogura et al. |
| 2017/0324350 | A1 | 11/2017 | Gonthier et al. |
| 2019/0214476 | A1 | 7/2019 | Menard |
| 2020/0202918 | A1 | 6/2020 | Le et al. |

FOREIGN PATENT DOCUMENTS

| | | | |
|---|---|---|---|
| EP | 1324394 | A1 | 7/2003 |
| EP | 1672699 | A1 | 6/2006 |
| FR | 2664741 | A1 | 1/1992 |
| FR | 2895600 | A1 | 6/2007 |
| GB | 1220894 | A | 1/1971 |
| JP | H05136015 | A | 6/1993 |
| WO | WO 0250915 | A1 | 6/2002 |
| WO | WO 2011135242 | A1 | 11/2011 |

OTHER PUBLICATIONS

Hadley, "Exam Mar. 2007, Problem 3", Graz University of Technology (Year: 2007).

Sahu et al., "Design and performance projection of symmetric bipolar charge-plasma transistor on SOI" *Electronics Letters* 50(20):1461-1463, 2014.

Toulon et al., "Analysis and Optimization of a Thyristor Structure Using Backside Schottky Contacts Suited for the High Temperature," *IEEE Transactions on Electron Devices* 60(11):3814-3820, 2013.

Tung, "The physics and chemistry of the Schottky barrier height," *Applied Physics Reviews 1*: 011304, 2014 (55 pages).

* cited by examiner

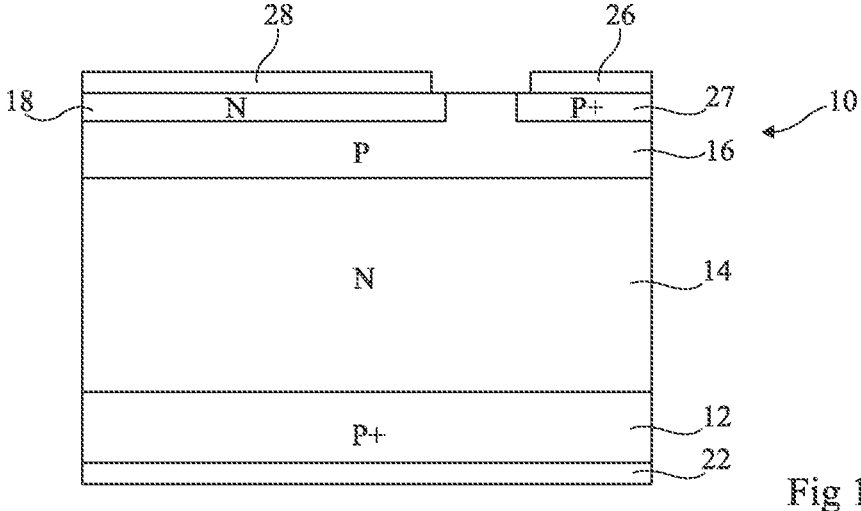
Fig 1
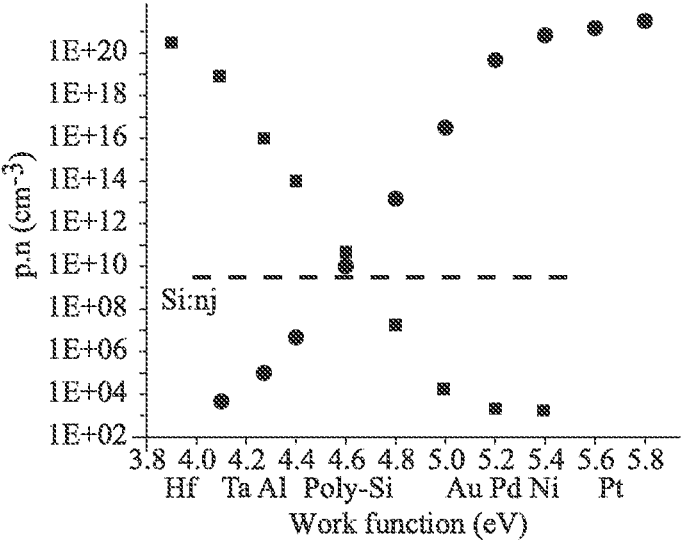
Fig 2
Fig 3

SEMICONDUCTOR TRIODE

BACKGROUND

Technical Field

The present disclosure concerns electronic components comprising more than one PN junction, and more particularly triodes.

Description of the Related Art

Various electronic components comprise more than one PN junction, that is, more than one contact between a P-type semiconductor material and an N-type semiconductor material.

A triode is defined as being an electronic component comprising three terminals, for example, cathode, anode, gate, or emitter, collector, and base. Transistors, thyristors, and triacs are examples of triodes. Such triodes comprise more than one PN junction.

BRIEF SUMMARY

At least one embodiment provides a vertical semiconductor triode comprising a first layer of semiconductor material, the first layer comprising first and second surfaces, the first surface being in contact with a first electrode forming a Schottky contact.

According to at least one embodiment, the second surface is in contact with a second layer of semiconductor material to form a PN junction.

According to at least one embodiment, the triode comprises a second electrode forming a Schottky contact.

According to at least one embodiment, the first electrode is at least partially made of a first metal.

According to at least one embodiment, the second electrode is at least partially made of the first metal.

According to at least one embodiment, the first layer is of type P and the work function of the first metal is smaller than the work function of the first layer.

According to at least one embodiment, the first layer is made of silicon and the work function of the first metal is smaller than 4.5 eV.

According to at least one embodiment, the first metal is hafnium.

According to at least one embodiment, the first metal is aluminum.

According to at least one embodiment, the first layer is of type N and the work function of the first metal is greater than the work function of the first layer.

According to at least one embodiment, the first layer is made of silicon and the work function of the first metal is greater than 5 eV.

According to at least one embodiment, the first metal is platinum.

According to at least one embodiment, the first electrode comprises portions made of the first metal connected to portions of a second metal, the contact between the second metal and the first layer being an ohmic contact.

According to at least one embodiment, the second metal is aluminum.

According to at least one embodiment, the second electrode comprises portions made of the first metal connected to portions made of a third metal, the contact between the third metal and the first layer being an ohmic contact.

According to at least one embodiment, the third metal is aluminum.

According to at least one embodiment, the first layer has a first doping level, the first layer comprising portions, in contact with the second electrode, having a second doping level and being of the same doping type as the rest of the first layer.

According to at least one embodiment, the second electrode is in contact with the second surface of the first layer.

According to at least one embodiment, the triode is a bipolar transistor.

According to at least one embodiment, the triode is a triac.

According to at least one embodiment, the triode is a thyristor.

According to at least one embodiment, the first layer has a first doping level, the first layer comprising portions, in contact with the first electrode, having a second doping level and being of the same doping type as the rest of the first layer.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIG. 1 schematically shows a prior art thyristor;

FIG. 2 shows an embodiment of a thyristor;

FIG. 3 shows the concentration of charge carriers under a Schottky contact for electrodes made of different metals;

DETAILED DESCRIPTION

Figure 4A:
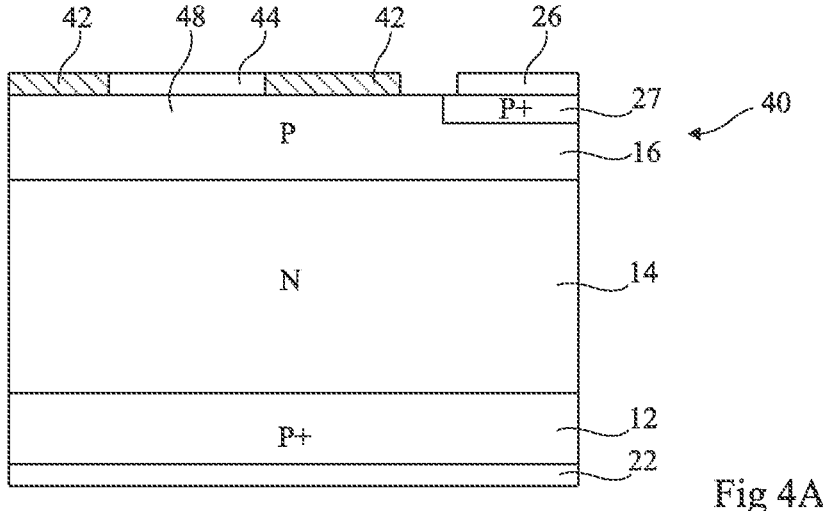
FIGS. 4A and 4B show other embodiments of thyristors.

The same elements have been designated with the same reference numerals in the various drawings and, further, the various drawings are not to scale. For clarity, only those steps and elements which are useful to the understanding of the described embodiments have been shown and are detailed. In particular, the peripheral elements of the semiconductor components are not detailed.

In the following description, when reference is made to terms qualifying the absolute position, such as terms "left-hand," "right-hand," etc., or the relative position, such as terms "top," "upper," "lower," etc., reference is made to the orientation of the concerned elements in the drawings. The terms "approximately" and "substantially" are used herein to designate a tolerance of plus or minus 10%, preferably of plus or minus 5%, of the value in question.

Vertical components, that is, components having their different semiconductor layers located on top of one another, are here considered.

FIG. 1 schematically shows an example of a prior art thyristor 10. In the example of FIG. 1, thyristor 10 comprises a first layer 12 of P-type doped semiconductor material (P+) forming the anode. Thyristor 10 comprises a second layer 14 of N-type doped semiconductor material covering and being in contact with an upper surface of first layer 12. There thus is a PN junction between the first and second layers. Thyristor 10 comprises a third layer 16 made of P-type doped semiconductor material covering and in contact with the upper surface of second layer 14. There thus is a PN junction between the second and third layers. Third layer 16 forms the gate. Third layer 16 is less heavily doped than first layer 12. Thyristor 10 further comprises a fourth layer 18, which may be continuous or divided into a plurality of portions and being formed by implanting N-type dopants into third layer 16. There thus is a PN junction between the third and fourth layers. Fourth layer 18 forms the cathode.

Metal layers form an anode electrode 22, in contact with the lower surface of first layer 12, a gate terminal 26, in contact with a portion 27 of third layer 16 more heavily doped than the rest of third layer 16, and a cathode electrode 28, in contact with fourth layer 18. The contact between each terminal or electrode and the corresponding layer of semiconductor material is an ohmic contact.

An ohmic contact corresponds to a metal layer in contact with a semiconductor material, the metal layer having, if the semiconductor material is of type N, a work function smaller than that of the semiconductor material and, if the semiconductor material is of type P, a work function greater than the work function of the semiconductor material.

Variations can be observed in the behavior of thyristors which have been simultaneously formed in a same plate. For example, variations of electric characteristics such as the value of the turn-on current or the value of the hold current can be observed from one thyristor to another on a same plate. Such variations are at least partially caused by the method of forming fourth layer 18.

Fourth layer 18 is generally formed by implantation of phosphoryl trichloride ($POCl_3$) at a concentration greater than $10^{20}$ atoms/$cm^3$, followed by a diffusion anneal. The temperature is generally not homogeneous in the equipment used for the deposition, which causes variations in the doping profile. Further, the forming of chemical complexes from the oxygen of phosphoryl trichloride causes variations in the lifetime of charge carriers.

FIG. 2 shows an embodiment of a thyristor. FIG. 2 shows a thyristor 30 where fourth layer 18 has not been formed in third layer 16. FIG. 2 comprises elements similar to the elements of FIG. 1 designated with the same reference numerals. These elements are not detailed again.

The cathode electrode of thyristor 30, formed of a metal layer 32, forms a Schottky contact with the semiconductor material of the third layer 16. The Schottky contact replaces the prior art PN junction between the third and fourth layers with a Schottky metal/semiconductor junction.

Indeed, a Schottky contact corresponds to a metal layer in contact with a semiconductor material, the metal layer having, if the semiconductor material is of type N, a work function greater than that of the semiconductor material and if the semiconductor material is of type P, a work function smaller than the work function of the semiconductor material. The main charge carriers of the semiconductor material (electrons for an N-type semiconductor material and holes for a P-type semiconductor material) displace from the semiconductor material to the metal.

Thyristor 30 thus comprises three junctions and its behavior is similar to that of the prior art thyristor. Thyristors such as thyristor 30 are however not subject to variations of electric characteristics caused by the diffusion of dopants of fourth layer 18.

FIG. 3 shows the charge carrier concentration in the portion of a semiconductor substrate directly under and in contact with a metal layer forming a Schottky contact, according to the work function of the metal, for a P-type substrate (square) and an N-type substrate (circles).

It can be observed in FIG. 3 that, for a P-type substrate (squares), the lower the work function of the metal, the higher the electron concentration in the area directly under the metal. For example, for a work function of 3.9 eV, corresponding to hafnium (Hf), the electron concentration is approximately $5.10^{20}$ $cm^{-3}$.

For an N-type substrate, the higher the work function of the metal, the greater the hole concentration in the area directly under the metal. For example, for a metal having a work function of 5.6 eV, that is, platinum (Pt), the hole concentration is approximately $5.10^{20}$ $cm^{-3}$.

This phenomenon may however be considered as problematic. However, this phenomenon here enables to do without fourth layer 18 and thus to avoid problems linked to its diffusion.

It is considered, in the following numerical examples, that first layer 12 is for example made of P-type doped silicon having a dopant concentration approximately in the range from $10^{19}$ to $5.10^{19}$ $cm^{-3}$ and having a thickness for example in the range from 2 to 5 μm. Second layer 14 is for example made of N-type doped silicon with, for example, a dopant concentration approximately equal to $10^{14}$ $cm^{-3}$ and having a thickness for example of approximately 210 μm. Third layer 16 is for example made of P-type doped silicon having a dopant concentration in the range from $10^{15}$ to $10^{16}$ $cm^{-3}$, having a thickness for example in the range from 10 to 15 μm, and having a work function approximately equal to 4.9 eV.

Metal layer 32 is made of a metal having a work function smaller than that of third layer 16. In the case considered herein, a metal having a work function smaller than 4.5 eV may for example be selected. Preferably, the selected metal is hafnium, the electron concentration of the semiconductor directly under the metal then being approximately equal to $5.10^{20}$ $cm^{-3}$, or aluminum, which is currently used (work function equal to 4.25 eV), the electron concentration of the semi-conductor directly under the metal then being approximately equal to $10^{16}$ $cm^{-3}$.

Metal layers 22 and 26, forming ohmic contacts with the layers of semiconductor material in contact therewith, are for example made of aluminum. Indeed, layers 12 and 27 being heavily doped, the ohmic contact is thus ensured by tunnel effect.

Figure 4B:
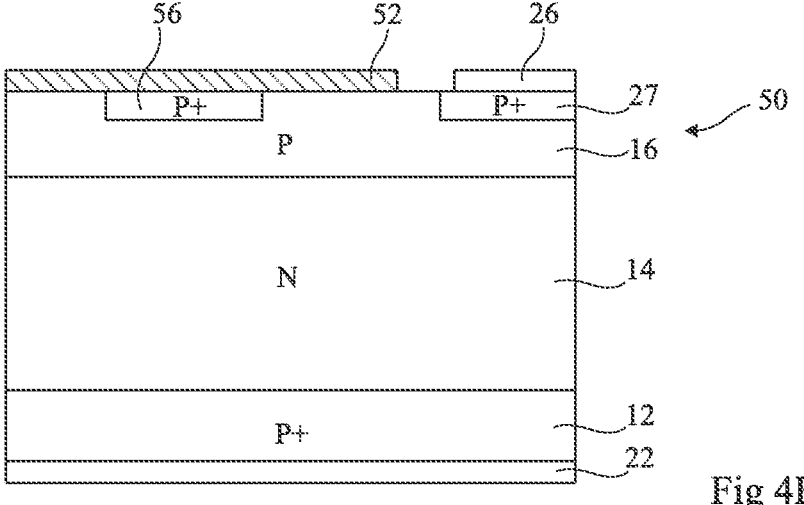

FIGS. 4A and 4B show other embodiments of thyristors where fourth layer 18 has not been formed. FIGS. 4A and 4B comprise elements similar to elements of FIG. 1 designated with the same reference numerals. These elements are not detailed again.

FIG. 4A shows a thyristor 40 having its cathode electrode formed of metal portions 42 (two of which are shown) forming Schottky contacts with the semiconductor material of third layer 16. Portions 42 are electrically connected to one another, for example, by metal portions 44 forming ohmic contacts with a portion 48 of the semiconductor material of layer 16.

FIG. 4B shows a thyristor 50 having as a cathode electrode a metal layer 52 similar to metal layer 32 of FIG. 2. Metal layer 52 covers third layer 16 including regions 56 of third layer 16. In FIG. 4B, a region 56 is shown. Regions 56 are regions which have been more heavily doped than the rest of third layer 16 before the forming of cathode electrode 52. Regions 56 for example have a doping substantially equal to the doping of portion 27 or of first layer 12. This doping difference enables to ensure the forming of an ohmic contact, by tunnel effect, between regions 56 and metal layer 52.

The cathode electrodes of FIGS. 4A and 4B are thus divided into portions forming Schottky-type metal/semiconductor junctions and portions which do not form such junctions. The cathode electrode is thus electrically connected, in places, with the semiconductor layer forming the gate without crossing a Schottky-type metal/semiconductor junction, which is not true for the cathode electrode of FIG. 2. In the case of the example of FIG. 2, metal layer 32 is continuous and forms a Schottky contact along its entire length. Thyristor 30 obtained in FIG. 2 may then be relatively sensitive, that is, for example, have a low turn-on current, for example, smaller than 100 µA, as compared with those of the thyristors of FIGS. 4A and 4B.

Layers 42 (FIG. 4A) and 52 (FIG. 4B) are for example, like layer 32 of FIG. 2, made of a metal having a work function smaller than that of third layer 16. In the previously-described numerical case, a metal having a work function smaller than 4.5 eV may for example be selected. Preferably, the selected metal is hafnium, or aluminum.

Portions 44 (FIG. 4A) are for example made of aluminum, like layers 22 and 26 of FIG. 2.

Figures 5, 6A, 6B:
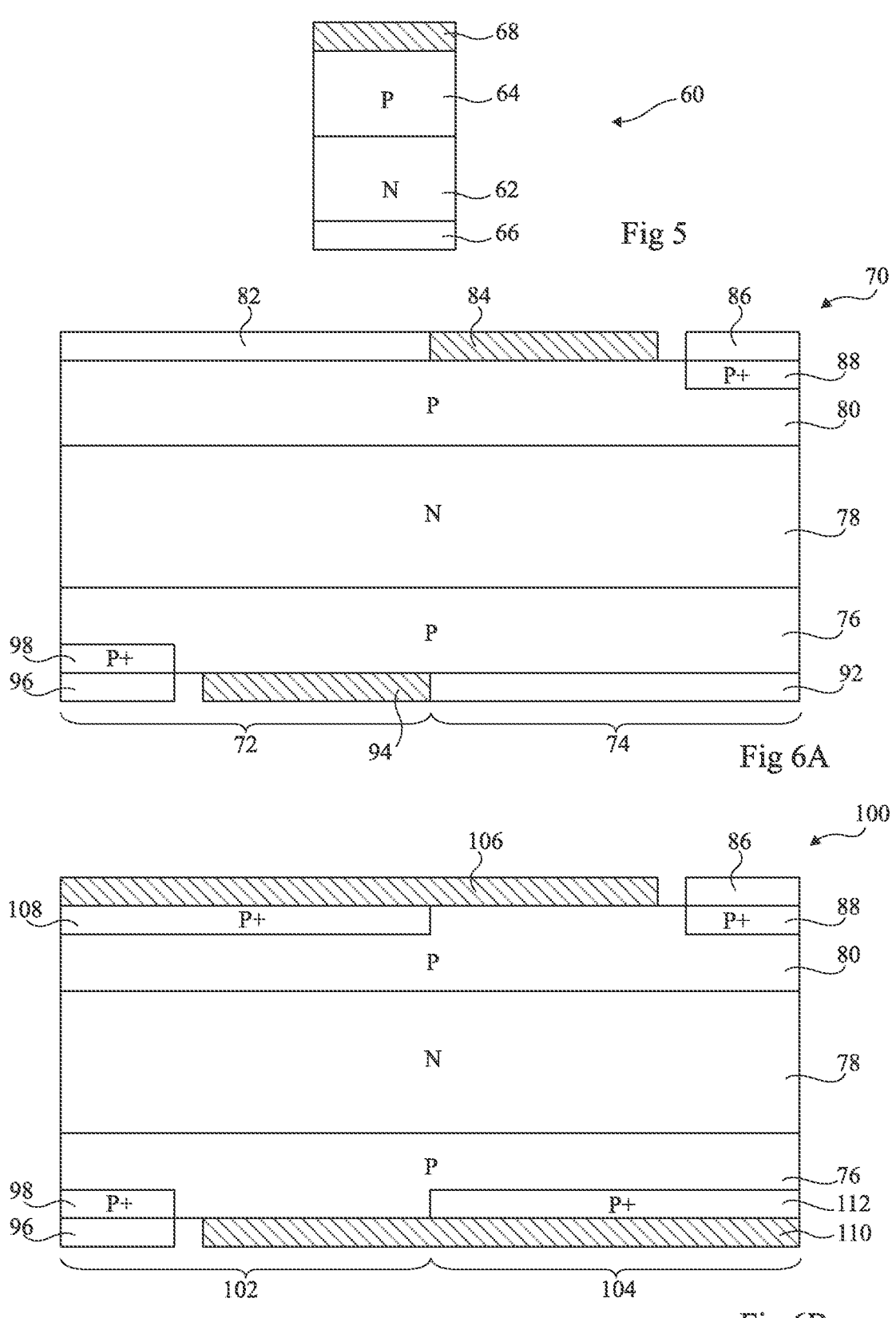
FIG. 5 shows an embodiment of a bipolar transistor.
FIGS. 6A to 6C show embodiments of triacs.

FIG. 5 shows an embodiment of a vertical bipolar transistor 60. A prior art vertical bipolar transistor generally comprises three layers of semiconductor material located above one another to form two PN junctions.

According to the embodiment of FIG. 5, transistor 60 comprises two layers 62 and 64 of semiconductor material. N-type doped layer 62 forms the emitter or the collector and is in contact by its upper surface with the lower surface of P-type doped layer 64 and forming the base.

The lower surface of layer 62 is in contact with a metal layer 66. Metal layer 66 and semiconductor material layer 62 form an ohmic contact.

A metal layer 68 forms a Schottky contact (a Schottky-type metal/semiconductor junction) with semiconductor material layer 64. Layer 68 forms the collector or emitter electrode of transistor 60.

Transistor 60 thus effectively comprises two junctions forming a collector and an emitter separated by a base.

Figure 6C:
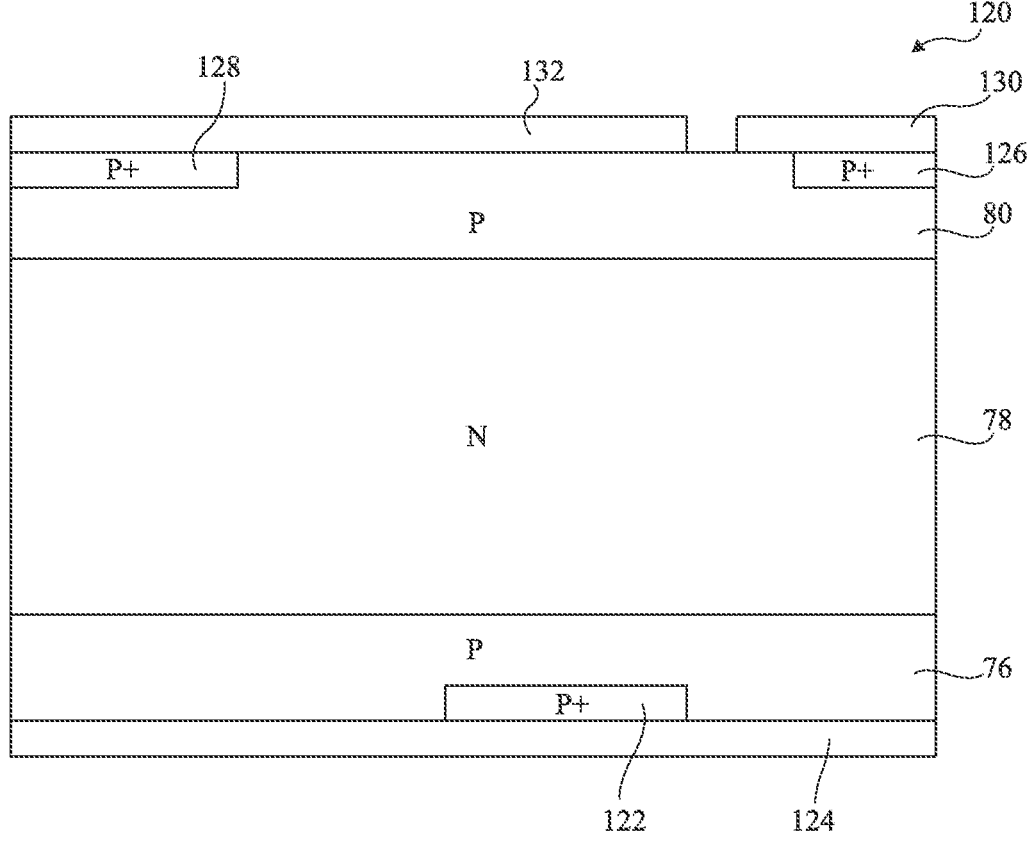

FIGS. 6A to 6C each show an embodiment of two head-to-tail thyristors forming a triac.

FIG. 6A shows a triac 70 comprising a thyristor 72, on the left-hand side, and a thyristor 74, on the right-hand side. The cathode of each thyristor 72 and 74 is formed like that of the thyristor of FIG. 2.

Triac 70 comprises an N-type semiconductor substrate 78, common to the two thyristors 72 and 74. The lower surface of substrate 78 is in contact with a layer 76 of P-type doped semiconductor material, forming the gate of thyristor 72 and the anode of thyristor 74. The upper surface of substrate 78 is in contact with a layer 80 of P-type semiconductor material, forming the anode of thyristor 72 and the gate of thyristor 74.

The upper surface of layer 80 is covered on its left-hand portion with a metal layer 82 forming an ohmic contact with layer 80 and forming the anode electrode of thyristor 72. The upper surface of layer 80 is partially covered, on the right-hand side, with a layer 84 of metal forming a Schottky contact with layer 80 and forming the cathode electrode of thyristor 74. The upper surface of layer 80 is also partially covered with a metal layer 86 forming an ohmic contact with a portion 88 of layer 80 more heavily P-type doped than the rest of layer 80. Layer 86 forms the gate contact of thyristor 74. Layer 84 is electrically connected to layer 82, for example, by direct contact, and electrically insulated from layer 86.

Similarly, the lower surface of layer 76 of semiconductor material is covered, on the right-hand side, with a metal layer 92 forming an ohmic contact with semiconductor material layer 76 and forming the anode electrode of thyristor 74. The lower surface of layer 76 is, on the left-hand side, partially covered with a metal layer 94 forming a Schottky contact with layer 76 and forming the cathode electrode of thyristor 72. The lower surface of layer 76 is also covered with a metal layer 96 forming an ohmic contact with a portion 98 of layer 76 more heavily P-type doped than the rest of layer 76. Layer 96 forms the gate terminal of thyristor 72. Layer 94 is electrically connected to layer 92, for example, by direct contact, and electrically insulated from layer 96.

Thus, layer 82 and layer 84, connected to each other, form a terminal of triac 70, and layers 92 and 94, connected to each other, form the second terminal of triac 70, and layers 86 and 96 form the gate terminals.

FIG. 6B shows a triac 100. FIG. 6B comprises elements similar to elements of FIG. 6A which will be designated with the same reference numerals and will not be detailed again.

Triac 100 comprises a metal layer 106 replacing metal layers 82 and 84. The metal of layer 106 is the same metal as the metal of layer 84. The region 108 of layer 80 located, on the left-hand side, under the portion of layer 106 replacing layer 82, is more heavily P-type doped than the rest of layer 80.

Similarly, layers 92 and 94 are replaced with a single metal layer 110 made of the same metal as layer 94. Region 112 of layer 76 under the right-hand portion of layer 110 is more heavily P-type doped than the rest of layer 76.

As a variation, the cathode of the thyristors of FIGS. 6A and 6B may be formed like the cathode of the thyristor of FIG. 4A or that of FIG. 4B, that is, divided into portions.

FIG. 6C shows an embodiment of a triac 120. FIG. 6C comprises elements similar to elements of FIGS. 6A and 6B which will be designated with the same reference numerals and will not be detailed again.

Triac 120 comprises substrate 78 (of type N) and previously-described layers 76 (of type P) and 80 (of type P).

Layer 76 comprises, on its lower surface side, a P-type doped area 122 (P+) more heavily doped than the rest of layer 76.

An electrode 124 covers the lower surface of layer 76. Electrode 124 forms, with area 122, an ohmic contact and, with the rest of layer 76, a Schottky-type metal/semiconductor material junction. Electrode 124 corresponds to the anode electrode of triac 120.

Layer 80 comprises, on its upper surface side, P-type doped areas (P+) 126 and 128, more heavily doped than the rest of layer 80.

An electrode 130 covers area 126 and a portion of the rest of layer 80. Electrode 130 forms, with area 126, an ohmic contact and, with the rest of layer 80, a Schottky-type metal/semiconductor material junction. Electrode 130 corresponds to the gate terminal of triac 120.

An electrode 132 covers area 128 and a portion of the rest of layer 80. Electrode 132 forms, with area 126, an ohmic contact and, with the rest of layer 80, a Schottky-type metal/semiconductor material junction. Electrode 132 corresponds to the cathode electrode of triac 120.

The possible materials for electrodes 124, 130, and 132 are the same as for previously-described electrodes 68, 84, 94, 106, or 110.

In the case where the doping types of the various previously-described components are inverted, that is, the semiconductor material with which the Schottky contact is formed is of type N, the different embodiments remain applicable. The metal of the Schottky contact is then selected to have a work function greater than the work function of the N-type doped semiconductor material of the Schottky contact. The metal of the Schottky contact is then for example made of a metal having a work function greater than 5 eV, for example, platinum, having a work function approximately equal to 5.6 eV.

An advantage of the embodiments described herein is that the manufacturing method comprises one less doping step, since the doping of portions 56, 108, or 128 may be performed during the doping of portions 27, 88, or 126.

Specific embodiments have been described. Various alterations, modifications, and improvements will occur to those skilled in the art. More specifically, in the case of a transistor, layer 62 might not be present. In this case, layer 64 then forming the substrate is in contact, on each side, with an electrode forming a Schottky-type metal/semiconductor material junction.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first semiconductor layer having a first surface and a second surface opposite to the first surface, the first semiconductor layer having a first conductivity type with a first concentration;
a first region and a second region in the first semiconductor layer at the first surface, the first and second regions having the first conductivity type with a second concentration, the first region being spaced from the second region by a third region at the first surface of the first semiconductor layer having the first conductivity type with the first concentration;
a second semiconductor layer on the second surface of the first semiconductor layer, the second semiconductor layer having a second conductivity type;
a third semiconductor layer having the first conductivity type and is spaced from the first semiconductor layer by the second semiconductor layer, the third semiconductor layer having a third surface facing away from the first semiconductor layer; and
a fourth region and a fifth region in the third semiconductor layer at the third surface, the fourth region and the fifth region having the first conductivity type with the second concentration.

2. The device of claim 1, further comprising a first electrode on the first region, fully covering the first region, and partially on the third region.

3. The device of claim 2, further comprising a second electrode on the second region, fully covering the second region and partially on the third region, the second electrode spaced apart from the first electrode.

4. The device of claim 3, further comprising a third electrode on the fourth region and fully covering the fourth region.

5. The device of claim 4, further comprising a fourth electrode on the fifth region and fully covering the fifth region.

6. The device of claim 1, further comprising a first sidewall and a second sidewall opposite to the first sidewall, and wherein the first region of the first surface of the first semiconductor layer is at a first sidewall and the second region of the first surface of the first semiconductor layer is at the second sidewall.

7. The device of claim 6, wherein:
the first sidewall includes respective sidewalls of the first region, the third region, the second semiconductor layer, the third semiconductor layer, and a third electrode; and
the second sidewall includes respective sidewalls of the second region, the third region, the second semiconductor layer, the third semiconductor layer, and the third electrode.

8. The device of claim 1, wherein:
the third semiconductor layer includes a sixth region at the first surface of the first semiconductor layer having the first conductivity type with the first concentration; and
the fourth region is spaced from the fifth region by the sixth region.

9. The device of claim 8, further comprising:
a first electrode on the first region, fully covering the first region, and partially on the third region.

10. The device of claim 9, further comprising a second electrode on the second region, fully covering the second region and partially on the third region, the second electrode spaced apart from the first electrode.

11. The device of claim 10, further comprising a third electrode on the fourth region and fully covering the fourth region.

12. The device of claim 11, further comprising a fourth electrode on the fifth region and fully covering the fifth region, and partially on the sixth region.

13. The device of claim 8, wherein:
the third region fully extends from a first end of the first region to a second end of the second region; and
the sixth region fully extends from a third end of the fourth region to a fourth end of the fifth region.

14. A device, comprising:
a first layer of a first conductivity type of a first concentration having a first surface and a second surface opposite to the first surface;
a first region in the first layer and at the first surface, the first region having the first conductivity type of a second concentration, and the second concentration is greater than the first concentration;
a second region in the first layer and at the first surface, the second region having the first conductivity type of the second concentration;
a second layer of a second conductivity type on the second surface of the first layer, the second conductivity type being different than the first conductivity type;
a third layer of the first conductivity type of the first concentration having a third surface and a fourth surface opposite to the third surface, the fourth surface having the first concentration of the first conductivity type, the third surface is covered by the second layer, and a third region in the fourth surface, and the third region has the first conductivity type of the second concentration;
a first electrode on and abuts the first region and on the first surface;
a second electrode on and abuts the second region and on the first surface; and

a third electrode on the fourth surface, and the third electrode abuts the fourth surface of the third layer and abuts the third region in the fourth surface.

15. The device of claim 14, further comprising a first sidewall and a second sidewall opposite to the first sidewall, and wherein the first region at the first surface of the first layer is at a first sidewall and the second region at the first surface of the first layer is at the second sidewall.

16. The device of claim 14, further comprising a first sidewall and a second sidewall opposite to the first sidewall, and wherein the first region at the first surface of the first layer is at a first sidewall and the second region at the first surface of the first layer is spaced inward from the second sidewall.

17. The device of claim 14, further comprising a fourth region in the third layer and at the fourth surface of the third layer, the fourth region having the first conductivity type of the second concentration.

18. The device of claim 17, wherein the third electrode is on the fourth region and fully covers the fourth region.

19. A device, comprising:

a first layer of a first conductivity type of a first concentration;

a first region in the first layer, the first region having the first conductivity type of a second concentration;

a first electrode on the first layer and in contact with the first concentration and the second concentration;

a second layer of the first conductivity type of the first concentration;

a second region in the second layer, the second region having the first conductivity type of the second concentration;

a second electrode on the second layer and in contact with the first concentration and the second concentration;

a third region in the second layer having the second concentration, the third region being spaced from the second region; and a fourth region in the first layer and having the second concentration, the fourth region being spaced from the first region.

20. The device of claim 19, further comprising a third electrode on the third region and a fourth electrode on the fourth region.

*  *  *  *  *